United States Patent [19]
Miyamoto et al.

[11] Patent Number: 5,703,503
[45] Date of Patent: Dec. 30, 1997

[54] WINNER-TAKE-ALL CIRCUIT

[75] Inventors: Masayuki Miyamoto, Nabari; Kunihiko Iizuka, Sakai; Mitsuhiko Fujio, Iizuka; Hirofumi Matsui, Ikoma-gun, all of Japan

[73] Assignee: Sharp Kabushiki Kaisha, Osaka, Japan

[21] Appl. No.: 653,946

[22] Filed: May 22, 1996

[30] Foreign Application Priority Data

May 24, 1995 [JP] Japan ................................. 7-125372

[51] Int. Cl.$^6$ .............................. G01R 19/00; H03K 5/22
[52] U.S. Cl. ............................ 327/58; 327/69; 327/71
[58] Field of Search .............................. 327/58–62, 69, 327/70, 71, 403, 404, 407, 408

[56] References Cited

U.S. PATENT DOCUMENTS

| | | | |
|---|---|---|---|
| 5,049,758 | 9/1991 | Mead et al. | 365/185.21 |
| 5,059,814 | 10/1991 | Mead et al. | 307/201 |
| 5,408,194 | 4/1995 | Steinbach et al. | 327/62 |
| 5,606,271 | 2/1997 | Van Lammeren et al. | 327/58 |

OTHER PUBLICATIONS

Choi J. "A High–Precision VLSI Winner–Take–All Circuit for Self–Organizing Neural Network", *IEEE. Journal of Solid–State Circuits*, vol. 28, No. 5, pp. 576–584, 1993.

M. Ismail et al. "Analog VLSI: Signal and Information Processing", *McGraw–Hill, Inc.*, p. 100, FIG. 3.31, 1994.

*Primary Examiner*—Toan Tran
*Attorney, Agent, or Firm*—David G. Conlin; William J. Daley, Jr.

[57] ABSTRACT

A winner-take-all circuit for judging a channel receiving an analog signal having the largest or smallest value among multiple channels upon input of analog signals. Each basic circuit includes a detecting unit for comparing an input voltage with a reference voltage, and a feedback current generating unit for outputting a feedback current that determines a judging range in response to an output voltage from the detecting unit. The winner-take-all circuit also includes a tenth transistor serving as a common transistor to all the basic circuits. The tenth transistor secures, even when an input voltage is small, a current that should flow through a sixth transistor serially connected to the seventh transistor that determines an amount of a feedback current from the feedback current generating circuit. As a result, even when there are fewer k channels receiving input voltages having the highest level and slightly lower ones compared with all the n channels, a feedback current is secured in a sufficient amount to vary the reference voltage. In addition, the winner-take-all circuit of the present invention comprises analog circuits, thereby making the structure simpler compared with a counterpart that processes digital signals.

6 Claims, 7 Drawing Sheets

WINNER-TAKE-ALL CIRCUIT

FIELD OF THE INVENTION

The present invention relates to a winner-take-all circuit for judging a channel receiving an analog signal having the largest or smallest value among multiple channels upon input of analog signals.

BACKGROUND OF THE INVENTION

In a multi-channel circuit, a channel receiving an analog signal having the largest or smallest value is generally judged by converting each input analog signal into digital data and processing the same in a predetermined manner. Therefore, an amount of computation increases dramatically with increase in the number of channels, demanding a high-performance data processor. However, such a data processor is fabricated with more complicated circuits and consumes more power.

To solve this problem, there has been introduced a technique such that judges a channel receiving an analog input voltage having the largest value among multiple channels upon input of analog voltages. An example of such a technique is illustrated in FIG. 3.31 in page 100, Analog VLSI: Signal and Information Processing, Ismail, Fiez, McGraw-Hill, Inc. FIG. 4 shows an electric circuit diagram of a winner-take-all (WTA) circuit 1 in accordance with the above-cited prior art.

The j-channel (j=1, 2, ..., n) WTA circuit 1 includes basic circuits c1–cn each receiving an input voltage Vij entering into their respective channels.

More precisely, the basic circuit c1 comprises five field effect transistors q1–q5 each made of a MOS (Metal Oxide Semiconductor). The input voltage Vi1 enters into the gate terminal of the N-MOS transistor q1. The drain terminal of the transistor q1 is connected to the drain and gate terminals of the P-MOS transistor q2. The source terminal of the transistor q2 is connected to a power source line 2 of a high level Vdd.

The P-MOS transistor q3 is provided to form a current mirror circuit together with the transistor q2. The gate terminals of both the transistor q3 and q2 are connected to the drain terminal of the transistor q1. The source terminal of the transistor q3 is connected to the power source line 2 and the drain terminal of the same is connected to the drain terminal of the N-MOS transistor q4. A constant voltage Vb2 is applied to the gate terminal of the transistor q4, and the source terminal of the same is connected to a power source line 3 of a ground level. An output voltage Vo1 comes out from a connecting point 4 of the transistors q3 and q4 in response to the impedance therebetween.

The source terminal of the transistor q1 is connected to the drain terminal of the N-MOS transistor q5. The source terminal of the transistor q5 is connected to the power source line 3 and a constant voltage Vb1 is applied to the gate terminal of the same. Note that all of the transistors q1–q5 operate in the saturation region.

The other basic circuits c2–cn are of the same structure as the basic circuit c1. Connecting points 5 of the transistors q1 and q5 in all of the basic circuits c1–cn are interconnected through a connecting line cm1 and held at the same potential.

In each basic circuit cj thus structured, the relationship between a current I1 flowing through the transistor q1 and the output voltage Voj is illustrated in FIG. 5.

That is, the level of the output voltage Voj is low, Vdd/3 or lower, when the current I1 is equal to or lower than a current Ia; the output voltage Voj varies in a range (intermediate value) between Vdd/3 and 2·Vdd/3 exclusive when the current I1 is higher than the current Ia and lower than a current Ib; and the level of the output voltage Voj is high, 2·Vdd/3 or higher, when the current I1 is equal to or higher than the current Ib. Thus, the output voltage Voj is judged whether it has the high level, low level, or intermediate value depending on a judging range determined by the currents Ia and Ib.

The currents Ia and Ib are respectively expressed as:

$$r(2,3) \cdot I4 - \Delta Ia \text{ and } r(2,3) \cdot I4 + \Delta Ib$$

where I4 is a sample bias current which flows through the transistor q4 and is determined by the constant voltage Vb2, and r(2,3) is a ratio of the gate width-to-length (W/L) ratios of the transistors q2 and q3.

Thus, when each input voltage Vij enters into their respective basic circuits cj, an output voltage in response to each input voltage Vij satisfying a condition, current I1k≥Ib and I1j≤Ia (j≠k), is expressed as: Vok=high level and Voj=low level. In this manner, a single input voltage Vik having the largest value is detected from the multiple input voltages Vi1–Vin.

However, as indicated by reference numerals IO1, IO2, and IO3 in FIG. 6(a), if there is more than one current I1 equal to or higher than the current Ib, an output voltage Voj corresponding to each of the above currents has a high level, thereby disabling the WTA circuit 1 to judge which input voltage has the largest value. Therefore, the judging range of the WTA circuit 1 is not used effectively, and the competition resolution remains low.

To eliminate this problem, there has been proposed an effective use of the judging range by shifting the level of the current I1 to the low level side as shown by the reference numerals IO1a, IO2a, IO3a in FIG. 6(b). An example technique is disclosed in, A High-Precision VLSI Winner-Take-All Circuit for Self-Organizing Neural Networks, J. Choi and B. J. Sheu, IEEE Journal of Solid-State Circuits, Vol. 28, No. 5, pp576–584, May 1993. FIG. 7 illustrates an electrical circuit diagram of an example WTA circuit 11 in accordance with the above-cited prior art, and like components are labeled with like reference numerals with respect to FIG. 6, and the description of these components is not repeated for the explanation's convenience.

Each basic circuit caj in the WTA circuit 11 includes a feedback current generating circuit 12 comprising transistors q6–q10. In the feedback current generating circuit 12, an output voltage Voj from the connecting point 4 enters into the gate terminal of the N-MOS transistor q7. The source terminal of the transistor q7 is connected to the power source line 3 through the N-MOS transistor q6. Note that the source terminals of the transistors q7 in all the basic circuit ca1–can are interconnected through a connecting line cm2 and held at the same potential. A predetermined constant voltage Vb3 is applied to the gate terminal of the transistor q6. Therefore, a bias current I6 flowing through the transistor q6 in each basic circuit caj is regulated by the constant voltage Vb3.

The drain terminal of the transistor q7 is connected to the power source line 2 through the P-MOS transistor q8. The P-MOS transistor q9 is provided to form a current mirror circuit together with the transistor q8. The transistor q9 positive feeds back a current in proportion to the one flowing through the transistor q7 as a feedback current IF to the connecting point 5.

The N-MOS transistor q10 is provided to make a pair with the transistor q7. Both the gate and drain terminals of the transistor q10 are connected to the power source line 2, while both the source terminal of the same and the source terminal of the transistor q7 are connected to the drain terminal of the transistor q6. Note that all of the transistors q6–q10 operate in the saturation region.

This means that as the output voltage Voj becomes higher than a total of a voltage of the connecting line cm2 and a conductance threshold voltage Vth for the MOSFET, the feedback current IF is positive fed back more to the connecting point 5. Then, the current I1 flowing through the transistor q1, that is, the current I3 flowing through the transistor q3, decreases. Eventually, the output voltage Voj drops below the above total, upon which the transistor q7 goes off, and then the bias current I6 flowing through the transistor q6 is supplied from the transistor q10. The above action is performed in the basic circuits of all the channels sequentially in the order of smallness of the input voltages Vi1–Vin entering into their respective channels. As a result, the currents I1 of all the basic currents shift toward the low level side one by one, and finally, when a single current I1 exceeds the current Ib, the basic circuit generating that particular current I1 alone outputs a high-level output voltage Voj as a result.

Herein, let k ($k \geq 2$) be the number of channels outputting high-level output voltages Voj's. Then, if there are fewer k channels, for example, only two input voltages cause high-level output voltages and all the rest cause the low-level output voltages, the WTA circuit 11 can not feed back a current sufficiently. Then, the levels of the current I1 can not be shifted in the same manner as was illustrated in FIG. 6(b), that is, the current Ib positions between the two current values corresponding to the above two input voltages, thereby disabling WTA circuit 11 to judge which of the two input voltages has the larger value.

For further understanding, the following description will describe the reason why the feedback current becomes insufficient under the above condition. The elementary equation of a current I in the saturation region for the MOSFET is expressed as:

$$I = K \cdot (W/L) \cdot (Vgs - Vth)^2 \quad (1)$$

where K is a constant of proportion determined by the physical properties of the MOSFET, W/L is a width-to-length ratio of the gate, Vgs is a gate-source voltage, and Vth is a conductance threshold voltage for the MOSFET; note that the larger the W/L, the more the MOSFET conducts current.

Here, let n be the number of all the channels, the aforementioned k be the number of input channels having the largest value and slightly smaller ones, and let the remaining (n–k) input channels have the low-level inputs and outputs of 0V. Then, an amount of the feedback current IF to the connecting point 5 does not exceed, $$IF = r(9,8) \cdot n \cdot I6 \{ k/(k + r(10,7) \cdot n) \} \quad (2)$$

where n·I6 is a total of the bias currents I6 flowing through the transistors q6 of all the basic circuits c1–cn, and as previously mentioned, the bias current I6 is determined by the constant voltage Vb3 in each basic circuit cj. Therefore, the feedback current IF found by Equation (2) can be described as a value found by:

(a) diverting n·I6 by k transistors q7 that output high-level output voltages Voj's and n transistors q10; and (b) multiplying a diverted value by r(9,8).

Note that r(9,8) is a ratio of the gate width-to-length ratios of the transistors q9 and q8 forming the current mirror circuit, and r(10,7) is a ratio of the gate width-to-length ratios of the transistors q10 and q7.

When k inputs having substantially the equal level are separated, an amount of the current I1 flowing through the transistor q1 is defined by a balance between the reference voltage, that is, the source voltage of the transistor q1, and an input voltage Vij. Thus, k basic circuits for the k channels receiving the input voltages. Vij's having the largest value and slightly smaller ones and outputting high-level output voltages Voj's can secure sufficient bias current I5 that should flow from the transistor q1 to the transistor q5. Whereas the other (n–k) basic circuits that output low-level output voltages Voj's can not secure the bias currents I5 sufficiently. Thus, the (n–k) basic circuits demand feedback current IFa expressed as:

$$IFa = (n-k) \cdot I5 \quad (3)$$

Here, assuming that k representing the number of channels outputting high-level voltages Voj's is a constant number, the feedback currents IF and IFa are compared based on the orders with respect to all the n channels. For example, let n=∞, then the feedback current IF takes on a constant number, whereas the feedback current IFa diverges. Thus, as n becomes larger, it becomes more difficult to supply a feedback current IF such that satisfies the feedback current IFa required in practice, no matter what values are given to the parameters r(9,8), r(10,7), I5, and I6.

This is the reason why the levels of the current I1 can not be shifted as was explained in the above when there are fewer k channels receiving the input voltages Vij's having the largest value and slightly smaller ones compared to all the n channels. This causes deterioration of the competition resolution.

To solve this problem, a current capacity of the transistor q10 when n=1 may be reduced to 1/n when n>1. However, the electrode area or pattern width of the transistor q10 must be designed separately for n=16, 32, 64, . . . , and therefore, this solution is by no means practical. Moreover, if there are too many input channels, the electrode area or pattern width of the transistor q10 becomes so microscopic that they can not be designed by any existing designing rule.

SUMMARY OF THE INVENTION

It is therefore an object of the present invention to provide a winner-take-all circuit which can precisely judge a channel receiving an analog signal having the largest or smallest value among multiple channels upon input of analog signals with a simple structure omitting an A/D (analog/digital) convertor.

To fulfill the above object, a winner-take-all circuit of the present invention for judging an input voltage having one of a largest and smallest value among multiple input voltages is provided with:

(1) a plurality of detecting units each having, (a) a first transistor for conducting a current in an amount defined by a balance between one input voltage and a reference voltage, (b) a second transistor interposed between the first transistor and a first power source line, (c) a third transistor, connected to the first power source line, for making a pair with the second transistor to form a current mirror circuit, (d) a fourth transistor, interposed between the third transistor and a second power source line, for conducting a predetermined amount of a current, and (e) a fifth transistor, interposed between the first transistor and the second power source line, for conducting a predetermined amount of a current, each detecting unit outputting a voltage representing a result of a largeness detection among the input voltages from a connecting point of the third and fourth transistors, the plurality of detecting units being interconnected in parallel to hold connecting points of the first and fifth transistors in all of the detecting units at a same potential, (2) feedback current generating circuits in matching numbers with the detecting units each having, (f) a sixth transistor, connected to the second power source line, for conducting a predetermined amount of a current;

(g) a seventh transistor, connected to the sixth transistor, for conducting a current in an amount defined by a balance between a terminal voltage of the sixth transistor and an output voltage from the detecting unit;

(h) an eighth transistor interposed between the seventh transistor and the first power source line; and (i) a ninth transistor, connected to the first power source line, for making a pair with the eighth transistor to form a current mirror circuit, and for supplying a feedback current to the connecting point between the first and fifth transistors for varying the reference voltage;

(3) a tenth transistor serving as a common transistor, interposed between the first power source line and each sixth transistor, for supplying a bias current defined by a terminal voltage of each sixth transistor to each sixth transistor, wherein, let $r(9,8)$ be a ratio of gate width-to-length ratios of the ninth and eighth transistors, $r(10,7)$ be a ratio of gate width-to-length ratios of the tenth and seventh transistors, $I5$ and $I6$ be currents respectively flowing through the fifth and sixth transistors, then $I5$, $I6$, $r(9,8)$, and $r(10,7)$ are respectively set to specific values to satisfy a following equation:

$$r(9,8) \cdot I6 \cdot \{2/(2+r(10,7))\} > I5.$$

In the above-structured winner-take-all circuit, each detecting unit includes a serial circuit composed of the second, first, and fifth transistors and another serial circuit composed of the third and fourth transistors between the first and second power supply lines, which is shown in FIG. 1. For example, when the winner-take-all circuit is to judge a channel receiving an input voltage having the largest value, the first power source line in the side of the second and third transistors are set to a high level while the second power source line in the other side of the fifth and fourth transistors are set to a low level. Also, in the above-structured winner-take-all circuit, the second and third transistors are respectively, for example, P-MOSFET's, while the first, fourth, and fifth transistors are respectively N-MOSFET's.

An input voltage enters into the first transistor, which allows the passing of a current in an amount defined by a balance between the reference voltage applied to the source terminal thereof and the input voltage, that is, a potential difference between the gate and source terminals. A predetermined constant voltage is applied to the gate terminal of the fifth transistor interposed between the first transistor and second power source line, so that the fifth transistor allows a predetermined amount of a current to pass.

Also, the second transistor, interposed between the first transistor and the first power source line, makes a pair with the third transistor to form a current mirror circuit. Thus, a current in proportion to the one flowing through the first transistor flows through the third transistor. The fourth transistor, interposed between the third transistor and second power source line, is supplied with a predetermined constant voltage and thus allows the passing of a predetermined amount of a current in the same manner as the fifth transistor.

All the detecting units are interconnected in parallel, and the connecting points of the first and fifth transistors in all the detecting units are interconnected and held at the same potential (reference voltage). In each detecting unit, when an input voltage increases, an amount of the current flowing through the first transistor and hence the third transistor increases, while the impedance of the third transistor becomes smaller than the impedance of the fourth transistor. Therefore, an output voltage from each detecting unit through the connecting point of the third and fourth transistors increases in proportion to the input voltage. Thus, each detecting unit outputs a high-level output voltage in response to a relatively high input voltage compared with the reference voltage, which is in effect the potential maintained at the same level in each detecting unit.

In addition, the above-structured winner-take-all circuit includes the feedback current generating circuit comprising the sixth through ninth transistors. In the feedback current generating circuit, the sixth transistor, which allows the passing of a predetermined amount of a current like the first and fifth transistors, is connected to the second power source line. A current in an amount defined by a balance between the terminal voltage of the sixth transistor and an output voltage form the detecting unit flows into the seventh transistor to the sixth transistor. The current mirror circuit composed of the eighth and ninth transistors feeds back a current in proportion to the one flowing through the seventh transistor as the feedback current to the connecting point of the first and fifth transistor, or the point where the reference voltage is supplied to the first transistor.

Therefore, the higher an input voltage to the first transistor, the higher an output voltage from the connecting point of the third and fourth transistors, thereby increasing the feedback current. Thus, in each detecting unit, the reference voltage increases in response to a ratio of an amount of the current flowing through the first transistor to the predetermined amount of the current flowing through the fifth transistor. Eventually, the currents flowing through the first transistors decrease, and a single input voltage is judged to have the largest value. If the winner-take-all circuit is to judge a channel receiving an input voltage having the smallest value, polarity of the transistors and power source are reversed. Then, the currents flowing through the first transistors increase eventually, and a single input voltage is judged to have the smallest value. Therefore, according to the above winner-take-all circuit, it has become possible to precisely judge an input voltage having the largest or smallest value among a plurality of input voltages.

Besides the above structure, the above winner-take-all circuit further includes the tenth transistor serving as a common circuit between the second power source line and each sixth transistor. Thus, when an input voltage is small, the tenth transistor supplies a predetermined amount of a current that should flow through the six transistor from the second power source line by bypassing the seventh transistor. Note that in the winner-take-all circuit of the present invention, the parameters, $I5$, $I6$, $r(9,8)$, and $r(10,7)$, are respectively set to values such that satisfy the above equation.

As a result, the current $I6$, from which the feedback current is generated, is supplied in a sufficient amount to secure the current $I5$ in an amount necessary to generate the reference voltage. If the winner-take-all circuit is to judge a channel receiving an input voltage having the largest value, the feedback current generating circuit generates a sufficient feedback current even when there are relatively fewer channels receiving input voltages having the largest value and slightly smaller ones with respect to all the channels. As well, if the winner-take-all circuit is to judge a channel receiving an input voltage having the smallest value, the feedback current generating circuit generates a sufficient feedback current even when there are relatively fewer channels receiving input voltages having the smallest value and slightly larger ones with respect to all the channels. Therefore, the levels of the currents flowing through the first transistors are shifted in a manner to enable the detection of a channel receiving an input voltage having the largest or smallest value. Consequently, the winner-take-all circuit of the present invention can render high competition resolution and judge the channel receiving an input voltage having the largest or smallest value in a precise manner.

It is preferable that the above winner-take-all circuit further includes discrimination circuits in matching numbers with the detecting units. Each discrimination circuit is a judging circuit for receiving an output voltage from the detecting unit and outputting the output voltage after discriminating a level thereof. Also, each discrimination circuit is of a same structure as the detecting unit and comprises five transistors equivalent to the first through fifth transistors, respectively.

According to the above structure, even when there are a plurality of input voltages subject to judgment whether they have the largest or smallest value, the level of the output voltage from each detecting unit is discriminated by the discrimination circuit, thereby preventing the output voltage from being divided by the basic circuits. As a result, the winner-take-all circuit of the present invention can judge the largeness of the input voltage in a precise manner.

For a fuller understanding of the nature and advantages of the invention, reference should be made to the ensuing detailed description taken in conjunction with the accompanying drawings.

DESCRIPTION OF THE EMBODIMENTS (First Embodiment)

Figure 1:
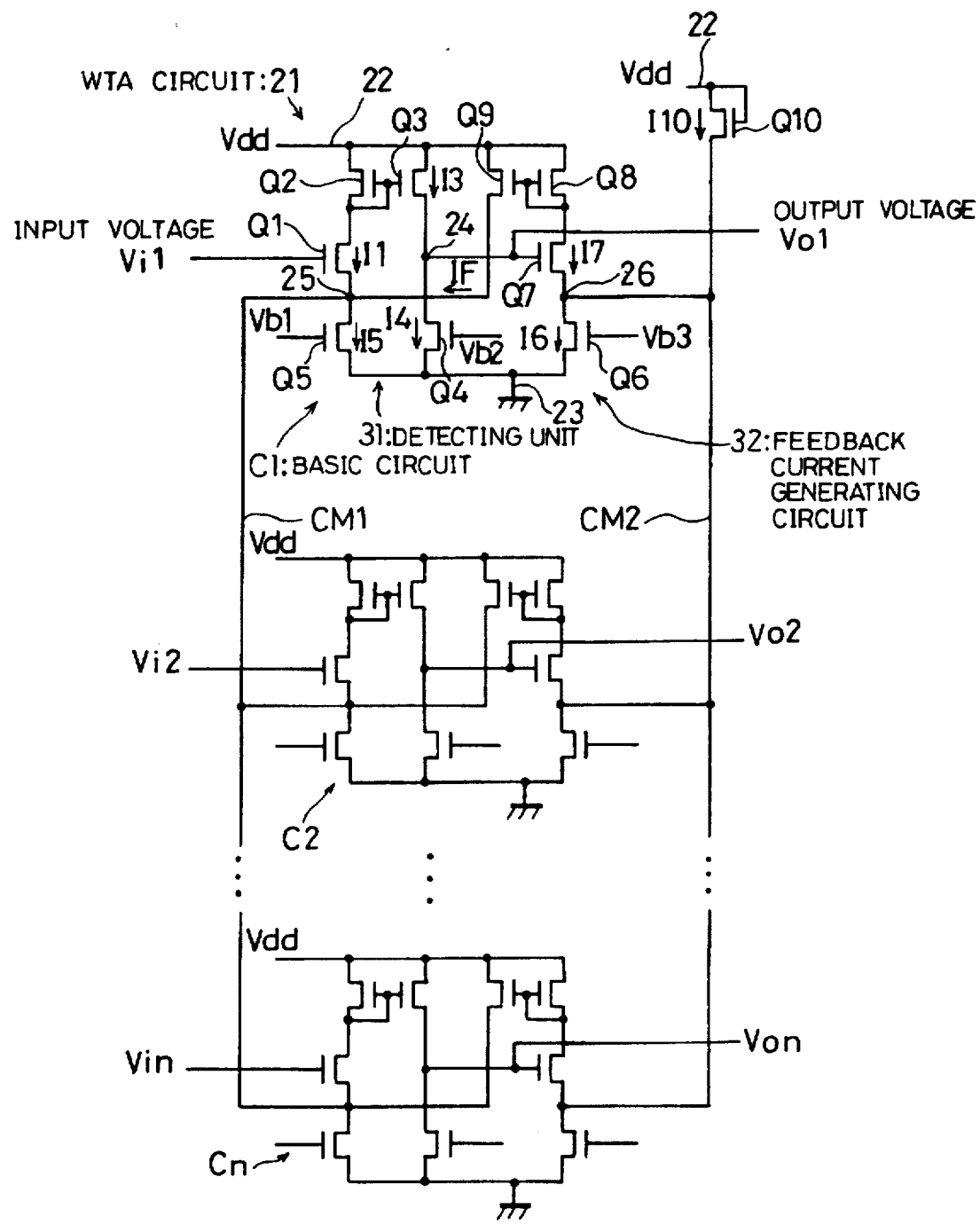
FIG. 1 is an electrical circuit diagram of a winner-take-all (WTA) circuit in accordance with an example embodiment of the present invention.

Referring to FIG. 1, the following description will describe an example embodiment of the present invention.

FIG. 1 is an electric circuit diagram of a winner-take-all (WTA) circuit 21 in accordance with an example embodiment of the present invention. The j-channel (j=1, 2, ..., n) WTA circuit 21 includes basic circuits C1–Cn each receiving an analog input voltage Vij entering into their respective channels.

More precisely, the basic circuit C1 comprises a detecting unit 31 and a feedback current generating circuit 32: the former includes five field effect transistors Q1–Q5 each made of a MOS, and the latter includes four field effect transistors Q6–Q9 each made of a MOS. In the former, an input voltage Vi1 enters into the gate terminal of the N-MOS transistor Q1. The drain terminal of the same is connected to both the drain and gate terminals of the P-MOS transistor Q2.

The source terminal of the transistor Q2 is connected to a power source line 22 (first power source line) of a high level Vdd. The P-MOS transistor Q3 is provided to form a current mirror circuit together with the transistor Q2. The gate terminals of the transistors Q3 and Q2 are connected to the drain terminal of the transistor Q1. The source terminal of the transistor Q3 is connected to the power source line 22, while the drain terminal of the same is connected to the drain terminal of the N-MOS transistor Q4.

A constant voltage Vb2 is applied to the gate terminal of the transistor Q4, and the source terminal of the same is connected to the other power source line 23 (second power source line) of a ground level. An output voltage Vo1 goes out from a connecting point 24 of the transistors Q3 and Q4 in response to the output impedance of the transistors Q3 and Q4. The source terminal of the transistor Q1 is connected to the drain terminal of the N-MOS transistor Q5. The source terminal of the transistor Q5 is connected to the power source line 23, and a constant voltage Vb1 is applied to the gate terminal of the same.

The output voltage Vo1 from the connecting point 24 enters into the gate terminal of the N-MOS transistor Q7 in the feedback current generating circuit 32. The source terminal of the transistor Q7 is connected to the power source line 23 through the N-MOS transistor Q6. A constant voltage Vb3 is applied to the gate terminal of the transistor Q6. Thus, a bias current I6 flowing through the transistor Q6 is regulated by the constant voltage Vb3 and stays at a constant level.

The drain terminal of the transistor Q7 is connected to the power source line 22 through the P-MOS transistor Q8. The transistor Q9 is provided to form a current mirror circuit together with the transistor Q8. The transistor Q9 positive feeds back a current in proportion to the one flowing through the transistor Q7 as a feedback current IF to the connecting point 25 of the transistors Q1 and Q5.

The basic circuits C2–Cn are of the same structure as the basic circuit C1. Connecting points 25 in all the basic circuits C1–Cn are interconnected through a connecting line CM1 and held at the same potential. Likewise, connecting points 26 of the transistors Q6 and Q7 in all the basic circuits C1–Cn are interconnected through a connecting line CM2 and held at the same potential.

Besides basic circuits C1–Cn as many as n input channels, the WTA circuit 21 of the present invention includes an N-MOS transistor Q10 serving as a common transistor to all the basic circuits C1–Cn for supplying a bias current I6 to each transistor Q6. The gate and drain terminals of the transistor Q10 are connected to the power source line 22 of the high level Vdd, while the source terminal of the same is connected to the drain terminal of each transistor Q6, namely, the connecting line CM2. Note that all of the transistors Q1–Q10 operate in the saturation region.

For further understanding of the above-constructed input detecting circuit 21, the operation of the detecting unit 31 will be explained below. The bias current I5 flowing through each transistor Q5 is regulated by the constant voltage Vb1 as previously mentioned. Also, the transistors Q5 are interconnected in parallel through the connecting line CM1. Thus, each transistor Q1 allows the passing of the current I1, or a current defined by a balance between the input voltage Vij and the source voltage of the transistor Q1. The source voltage of the transistor Q1 is the feedback currents IF from all the transistor Q9 and a total of the currents I5 flowing through their respective transistors Q5 (n·I5).

Accordingly, an output voltage Voj, which is a voltage defined by a balance between the impedance of the transistor Q3 in which the current I3 flows through and the impedance of the transistor Q4 in which the current I4 regulated by the constant voltage Vb2 flows through, goes out from the connecting point 24 and enters into the gate terminal of the transistor Q7. Then, the transistor Q7 takes in a current I7 from the transistor Q8. The current I7 is a current defined by a balance between the output voltage Voj entering into the transistor Q7 and the source voltage of the transistor Q7. The source voltage of the transistor Q7 is defined by a total of the currents I6 (n·I6) regulated by the bias voltage Vb3 in all the transistors Q6 interconnected in parallel. As a result, the transistor Q7 positive feeds back the current I7 to the connecting point 25 as the feedback current IF through the transistor Q9.

Figure 5:
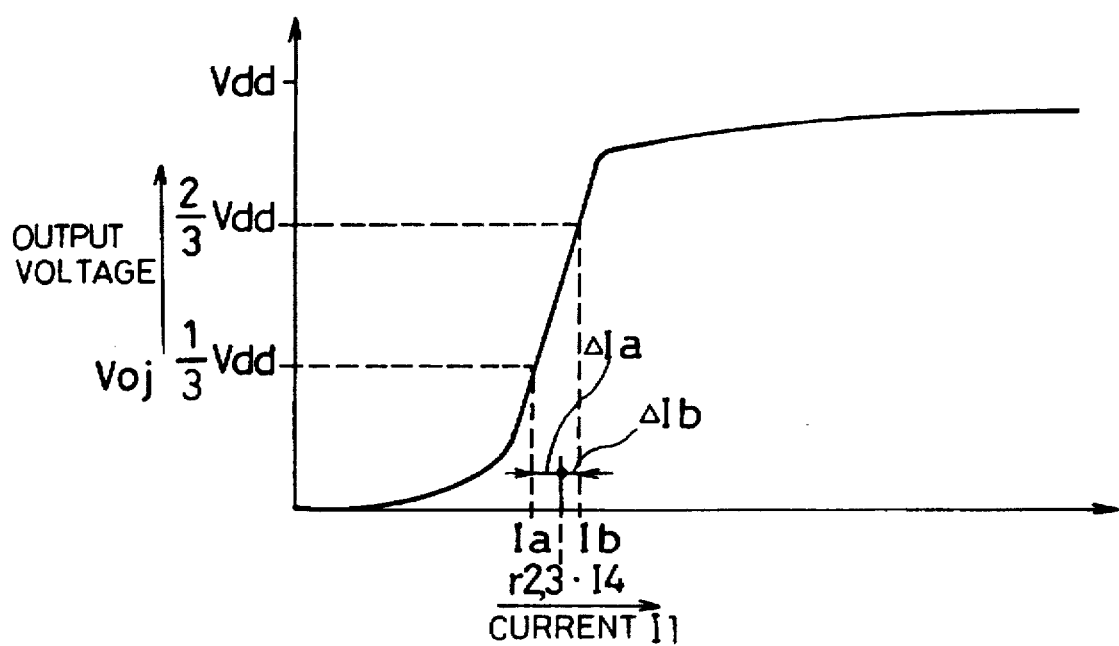
FIG. 5 is a graph explaining an operation of a basic circuit in each of the above WTA circuits.

That is to say, as shown in FIG. 5, the level of the output voltage Voj is low, equal to or lower than Vdd/3, when the current I1 is equal to or lower than a current Ia; the output voltage Voj varies in a range between Vdd/3 and 2·Vdd/3 exclusive when the current I1 is higher than the current Ia and lower than a current Ib; and the level of the output voltage Voj is high, equal to or higher than 2·Vdd/3, when the current I1 is equal to or higher than the current Ib.

Here, the currents Ia and Ib are respectively expressed as:

$$r(2,3)·I4-\Delta Ia, \text{ and } r(2,3)·I4+\Delta Ib$$

where I4 is a sample bias current which is regulated by the constant voltage Vb2 and flows through the transistor Q4, and r(2,3) is a ratio of the gate width-to-length ratios of the transistors Q2 and Q3.

As previously explained, as the output voltage Voj becomes higher than a total of the voltage of the connecting line CM2 and the conductance threshold voltage Vth for the MOSFET, the feedback current generating circuit 32 generates a larger feedback current IF to be positive fed back to the connecting point 25. Therefore, the higher the output voltage Voj, the less the transistor Q1 conducts the current I1, or the less the transistor Q3 conducts the current I3. On the other hand, the transistor Q7 goes off when the output voltage Voj drops below the above total. Then, the bias current I6 flowing through the transistor Q6 is supplied from the transistor Q10.

Since the above action is performed in all the basic circuits sequentially in the order of smallness of the input voltages Vij's entering into their respective basic circuits, the current I1 in each basic circuit shifts to the low level side one by one, and finally, when a single current I1 exceeds the current Ib, the basic circuit generating that particular current I1 alone outputs a high-level output voltage Voj as a result, thereby enabling the WTA circuit 21 to judge the channel receiving an input voltage having the largest value.

In the present invention, the single transistor Q10 serves as a common transistor to the basic circuits C1–Cn for supplying the bias current I6 to each transistor Q6. Thus, of all the bias currents n·I6, the current I10 flows through the transistor Q10 whether all the n channels increase or decrease. Also, the feedback current IF is expressed by Equation (4) below yielded from Equation (2) above:

$$IF=r(9,8)·n·I6·\{k/(k+r(10,7))\} \qquad (4)$$

where k is the number of channels receiving input voltages having the largest value and slightly smaller ones (substantially in the same level), r(9,8) is a ratio of the gate width-to-length ratios of the transistors Q9 and Q8 forming the current mirror circuit, and r(10,7) is a ratio of the gate width-to-length ratios of the transistors q10 and Q7.

Thus, as is shown in Equation (3) above, to always ensure a sufficient feedback current IF, the relationship, IF>IFa, must be satisfied, where IFa is a current demanded to supply the bias current I5 to (n−k) channels that output low level output voltages Voj's. However, it is understood from Equation (3) above that the feedback current IFa is a function that decreases as the k channels increase. Whereas it is understood from Equation (4) above that the feedback current IF is a function that increases as the k channels increase. This means that relationship, IF>IFa, must be satisfied when k=2.

Substituting k=2 into Equation (4) above yields:

$$r(9,8)·n·I6·\{2/(2+r(10,7))\}>(n-2)·I5. \qquad (5)$$

Thus, if $$r(9,8)·I6·\{2/(2+r(10,7))\}>I5 \qquad (6)$$

is satisfied, Equation (5) above is satisfied for n≥2, and hence, IF>IFa is satisfied.

Figure 6A:
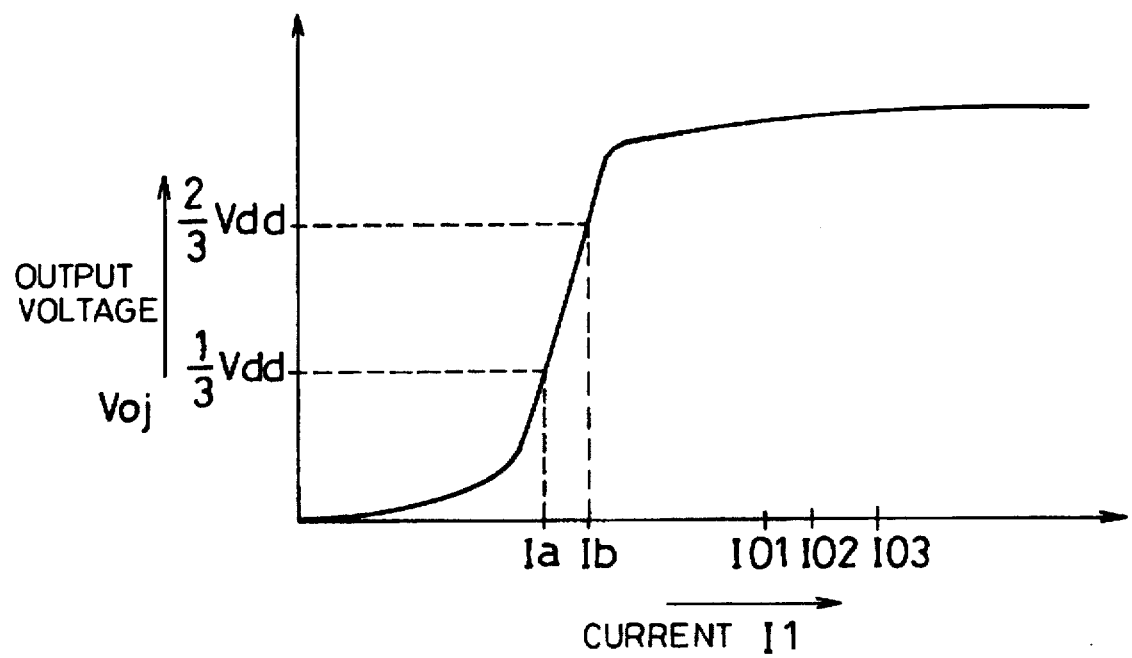
FIGS. 6(a) and 6(b) are graphs respectively explaining a problem caused by the above conventional basic circuit and detailing an operation of a feedback current generating circuit capable of eliminating the problem.
Figure 6B:
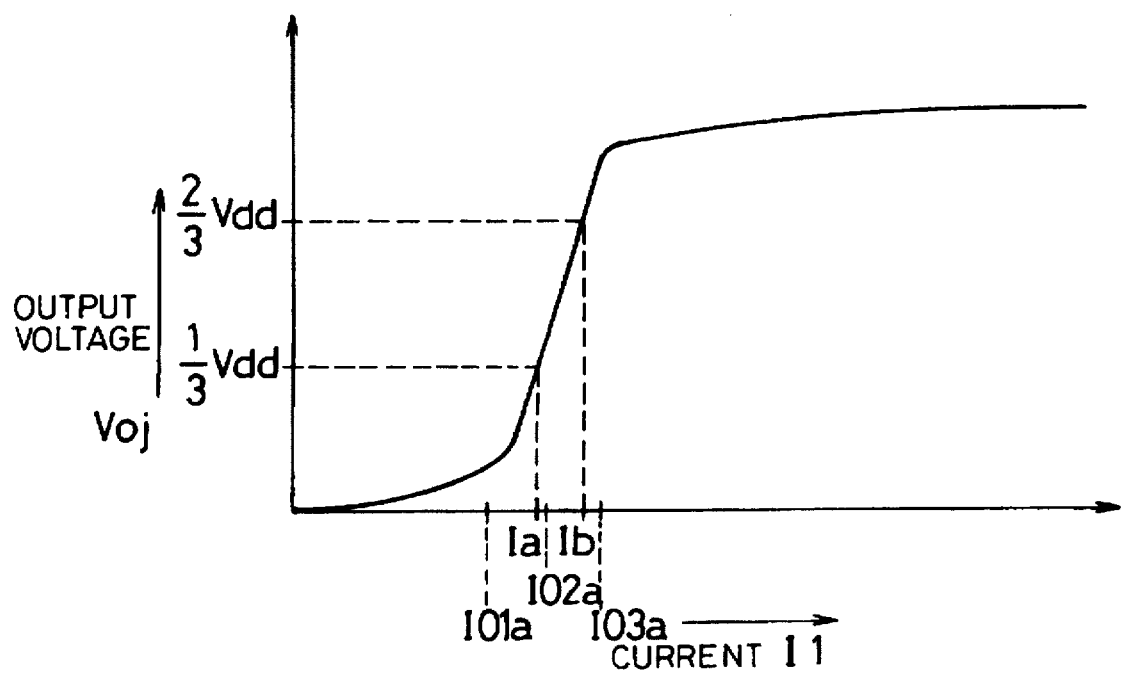
Figure 7:
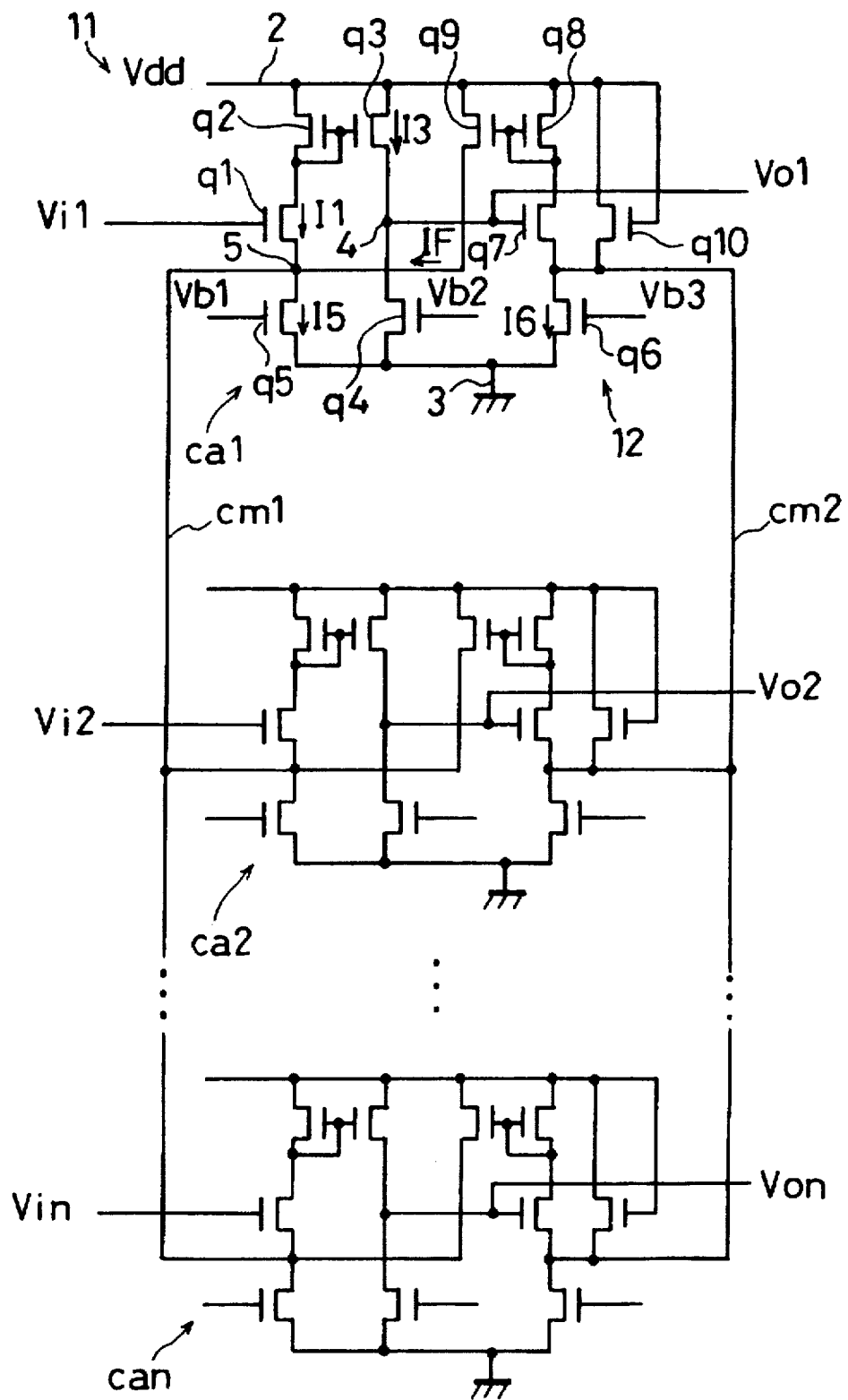
FIG. 7 is an electrical circuit diagram of another typical WTA circuit of a prior art.

Therefore, a sufficient feedback current IF can be secured by respectively setting the parameters I5, I6, r(9,8), and r(10,7) to adequate values such that satisfy Equation (6) above. As a result, the judging range is shifted as is shown in FIG. 6(b), making it possible to upgrade the competition resolution.

To be more specific, let I5:I6=2:1, and r(9,8)=4, then r(10,7)<2 is obtained from Equation (6) above. Thus, the transistors Q1 through Q10 and a constant voltage source generating the constant voltages Vb1, Vb2, and Vb3 are designed in such a manner to satisfy all the conditions specified as above.

As has been explained, the bypassing transistor Q10 is provided as the single common transistor for supplying the bias current I6 to the transistor Q6 in each basic circuit Cj. In addition, the transistors Q1 through Q10 are designed to satisfy the above-specified conditions. Thus, in the present invention, the current I6, from which the feedback current IF is generated, is supplied in a sufficient amount to secure the current I5 in an amount such that necessary to generate the reference voltage for the first transistor Q1.

Thus, even when there are fewer k channels receiving the input voltages having the largest value and slightly smaller ones, the feedback current IF such that can shift the judging range can be secured in a sufficient manner, thereby upgrading the competition resolution. Moreover, the transistor Q10 does not need modification even when all the n channels increase or decrease. For this reason, the transistor Q10 can be adopted by the existing design rules besides rendering enhanced general versatility.

The basic circuits may be cascaded in every input channel j, so that an output from the basic circuit in the first stage enters into the one in the second stage, an output from the one in the second stage enters into the one in the third stage, and so on. According to this structure, the gain of a small signal is increased by a factor of the power of the number of the stages, thereby enhancing the competition resolution.

For example, if each basic circuit has three stages and a gain per stage is A, then the gain for the small signal is increased by a factor of $A^3$.

Incidentally, in the above WTA circuit 21, the output from the basic circuit Cj may not represent the result of a largeness detection of the input voltages Vi1–Vin correctly under specific conditions. To be more specific, when there are a plurality of channels having the largest value and slightly smaller ones, all of the outputs in response to such inputs should be in the high level. In practice, however, as the k channels receiving such voltage inputs increase, the output voltages gradually drops from the high level of, for example, 3V, and cascading the basic circuits C1–Cn as previously mentioned does not solve this problem.

(Second Embodiment)

Figure 2:
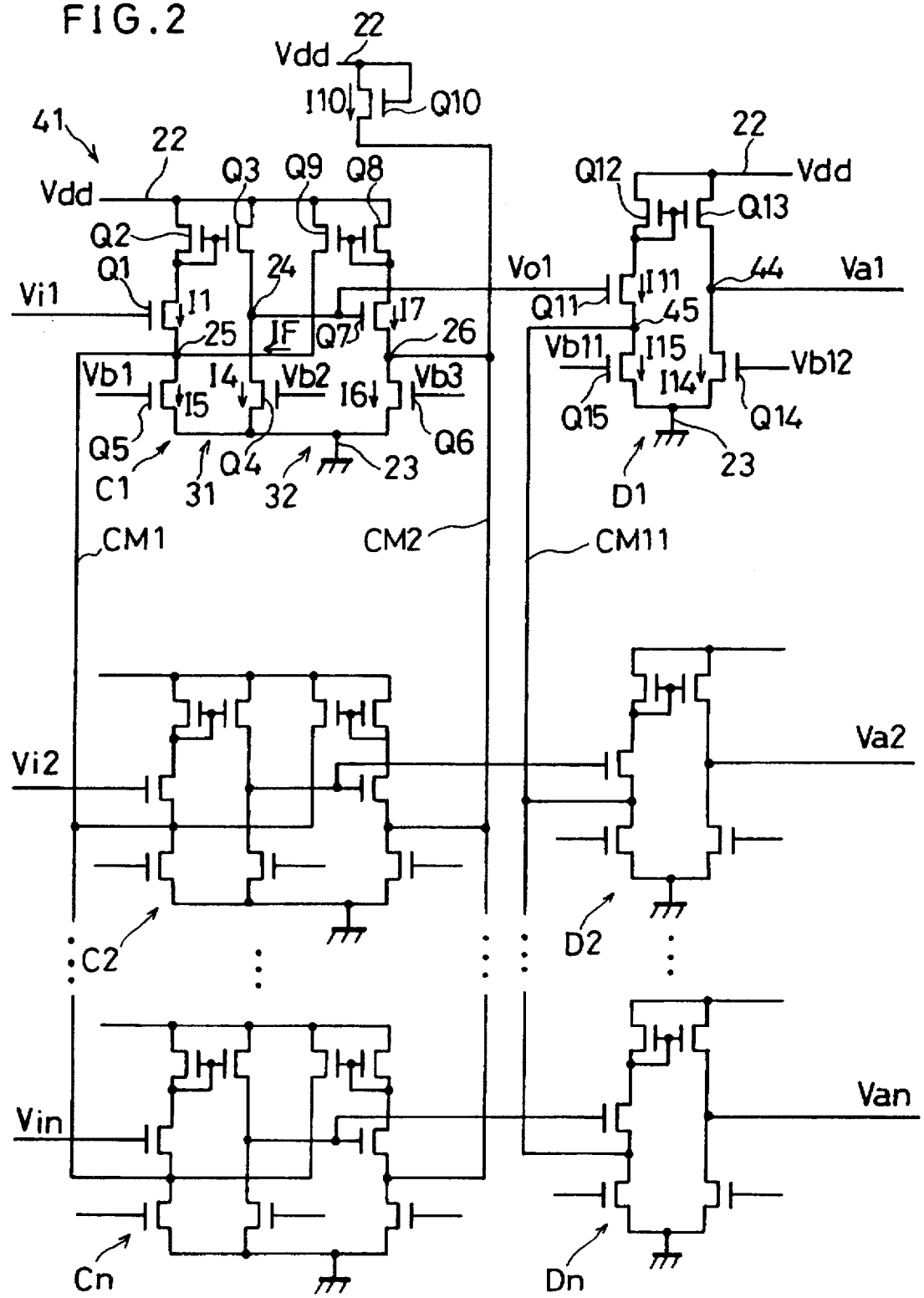
FIG. 2 is an electrical circuit diagram of a WTA circuit in accordance with another example embodiment of the present invention.

Referring to FIG. 2, the following description will describe another example embodiment of the present invention.

FIG. 2 is an electric circuit diagram of a winner-take-all (WTA) circuit 41 which can solve the problem that the counterpart in the first embodiment can not solve. In the drawing, like components are labeled with like reference numerals with respect to FIG. 1, and the description of these components is not repeated for the explanation's convenience.

The present embodiment is characterized in that a discrimination circuit Dj is provided in a stage following each basic circuit Cj. Although it will be described below, each discrimination circuit Dj judges whether the output voltage Voj from their respective basic circuit Cj is higher or lower than a common predetermined level, and outputs either a high-level or low-level output voltage Vaj based on the judgment.

Each discrimination circuit Dj includes transistors Q11 through Q15, which is of the same structure as the detecting circuit 31 comprising the transistors Q1 through Q5. An output voltage Voj from the basic circuit Cj in the preceding stage enters into the gate terminal of the transistor Q11. The output voltage Vaj representing the judgment result goes out from a connecting point 44 of the transistors Q13 and Q14.

Connecting points 45 of the transistors Q11 and Q15 in all the discrimination circuits Dj are interconnected through the connecting line CM11. The sample voltage referred in the first embodiment is supplied to each transistor Q11. A constant voltage Vb11 is applied to the gate terminal of the transistor Q15, and a bias current I15 flowing through the transistor Q15 is regulated by the constant voltage Vb11. Likewise, a constant voltage Vb12 is applied to the gate terminal of the transistor Q14, and a bias current I14 flowing through the transistor Q14 is regulated by the constant voltage Vb12.

Thus, the discrimination circuit Dj can be explained as the WTA circuit 21 omitting the feedback current generating circuit 32 in the basic circuit Cj, in other words, a WTA circuit that does not perform a feedback operation.

Assume that, in the above-structured WTA circuit 41, the k channels receiving input voltages having the largest value and slightly smaller ones respectively output output voltages Vo's, and the other (n–k) channels receive input voltages and output output voltages in the low level of 0V. Then, according to the conservation law of current, a total of the currents I6, n·I6, flowing into each transistor Q6 from the connecting line CM2 is equal to a sum of the current I10 flowing into the connecting line CM2 from the transistor Q10 and a total of the current I7 flowing from each transistor Q7, which is expressed as:

$$n \cdot I6 = Kr \cdot (Vdd - Vcm2 - Vthl)^2 + \quad (7)$$
$$k \cdot Kf \cdot (Vo - Vcm2 - Vthl)^2$$
$$= r(10,7) \cdot Kf \cdot (Vdd - Vcm2 - Vthl)^2 +$$
$$k \cdot Kf \cdot (Vo - Vcm2 - Vthl)^2$$

where Kr and Kf are constant numbers determined by the shapes of the transistors Q10 and Q7, respectively, and Kr=r(10,7)·Kf; Vcm2 is a voltage of the connecting line CM2; Vthl is a gate-source conductance voltage for the transistors Q10 and Q7.

On the other hand, a value found by multiplying the term representing the total of the currents I7 in Equation (7) above by a ratio of the gate width-to-length ratios of the transistors Q9 and Q8, r(9,8), is substantially equal to the feedback current IFa expressed by Equation (3) above. Thus, such a value is found by:

$$r(9,8) \cdot k \cdot Kf \cdot (Vo - Vcm2 - Vthl)^2 = (n-k) \cdot I5. \quad (8)$$

Therefore, Equations (7) and (8) yield:

$$r(9,8) \cdot \{n \cdot I6 - r(10,7) \cdot Kf \cdot (Vdd - Vcm2 - Vthl)^2\} = (n-k) \cdot I5$$
$$n \cdot I6 - r(10,7) \cdot Kf \cdot (Vdd - Vcm2 - Vthl)^2 = (n-k) \cdot I5/r(9,8)$$

thus, $$Vcm2 + Vthl = Vdd - \{(n \cdot I6 - (n-k) \cdot I5/r(9,8))/(r(10,7) \cdot Kf)\}^{1/2}. \quad (9)$$

Further, Equation (8) is rewritten as:

$$Vo - Vcm2 - Vthl = \{(n-k) \cdot I5/(r(9,8) \cdot k \cdot Kf)\}^{1/2}. \quad (10)$$

Thus, Equations (9) and (10) yield Equation (11) below which finds Vo:

$$Vo = Vdd + \{(n-k) \cdot I5/(r(9,8) \cdot k \cdot Kf)\}^{1/2} - \{(n \cdot I6 - (n-k) \cdot I5/r(9,8))/(r(10,7) \cdot Kf)\}^{1/2} \quad (11)$$

Therefore, the second and third terms in Equation (11) above are monotone decreasing functions in proportion to increase of the k channels receiving the input voltages having the largest value and slightly smaller ones. Thus, it is understood that the output voltage Voj from each basic circuit Cj decreases as the k channels receiving the input voltages having the largest value and slightly smaller ones increase.

In contrast, the following conditions must be satisfied to enable each discrimination circuit Dj to output a high-level Vaj: an input voltage Vi to the transistor Q11 must be equal to or higher than the one enabling the transistor Q11 to allow the passing of a current I11 such that makes the output voltage Vaj at the connecting point 44 larger than 2·Vdd/3 shown in FIG. 5.

On the other hand, with reference to Equation (1) above, the current I11 flowing through the transistor Q11 is expressed as:

$$I11 = K1 \cdot (Vi - Vcm11 - Vthn)^2 \quad (12)$$

where K1 is a constant number determined by the shape of the transistor Q11, Vi is an input voltage from the basic circuit Cj in the preceding stage, Vcm11 is a voltage of the connecting line CM11, and Vthn is a gate-source conductance threshold voltage for the transistor Q11.

Also, the bias current I15 flowing through the transistor Q15 is expressed as:

$$I15 = r(5,1) \cdot K1 \cdot (Vb11 - Vthn)^2 \quad (13)$$

where r(5,1) is a ratio of the gate width-to-length ratios of the transistors Q15 and Q11, Vb11 is a constant voltage applied to the gate terminal of the transistor Q15, and Vthn is a gate-source conductance threshold voltage for the transistor Q15.

To enable the transistor Q15, which allows the passing of the bias current I15, to operate in the saturated region, Equation (14) below which is yielded from Equation (13) above must be satisfied:

$$Vcm11 \geq Vb11 - Vthn = \{I15/(r(5,1) \cdot K1)\}^{1/2}. \quad (14)$$

Thus, Equations (12) and (14) yield:

$$Vi = (I11/K1)^{1/2} + Vcm11 + Vthn \geq \quad (15)$$
$$(I11/K1)^{1/2} + \{I15/(r(5,1) \cdot K1)\}^{1/2} + Vthn$$

The condition to enable each discrimination circuit Dj to output a high-level output voltage Vaj is, as shown in FIG. 5, expressed as: $I11 \geq r(2,3) \cdot I14 + \Delta Ib$. Thus, from the above Equations, a condition expressed as below is established:

$$Vi \geq \{(r(2,3) \cdot I14 + \Delta Ib)/K1\}^{1/2} + \{I15/(r(5,1) \cdot K1)\}^{1/2} + Vthn \quad (16)$$

where r(2,3) is a ratio of the gate width-to-length ratios of the transistors Q12 and Q13, I14 is a bias current which is determined by the constant voltage Vb12 and flows through the transistor Q14.

Thus, even when the k channels receiving input voltages having the largest value and slightly smaller ones increase and the level of the output voltage Voj from the basic circuit Cj in the preceding stage decreases, the discrimination circuit Dj can output high-level output voltage Vaj only if the output voltage Voj, or namely, input voltage Vi, satisfies Equation (16) above.

To be more specific, let Vdd=3V, Vthn=0.7V, I5:I4:I6= 2:2:1, r(2,3)=1, R(5,1)=1, r(9,8)=4, I6/Kf=1/20, I5/K1=1/10, and $\Delta Ib/K1 = 1/80$, then the output voltage Voj is found using Equation (11) above:

$$Voj = 3 + \{(n-k) \cdot 2/(4 \cdot 20 \cdot k)\}^{1/2} -$$
$$\{(n/20 - (n-k) \cdot 2/(4 \cdot 20))/r(10,7)\}^{1/2}$$
$$= 3 + \{(n-k)/40 \cdot k)\}^{1/2} -$$
$$\{(n+k)/(40 \cdot r(10,7))\}^{1/2}.$$

Further, let $r(10,7)=1/2$ to satisfy a condition found by substituting the above parameters into Equation (6) above: r(10,7)<2, then:

$$Voj = 3 + \{(n-k)/(40 \cdot k)\}^{1/2} - \{(n+k)/20\}^{1/2}.$$

Therefore, given n=64 (n representing the number of all the channels), then the output voltage Voj is found as follows:

$$Voj = 3 + \{(64-k)/(40 \cdot k)\}^{1/2} - \{(64+k)/20\}^{1/2}.$$

The output voltages Voj from each basic circuit Cj when varying the k channels receiving input voltage having the largest value and slightly smaller ones are set forth in TABLE 1 below.

TABLE 1

| k | VO |
|---|------|
| 1 | 2.45 |
| 2 | 2.06 |
| 10 | 1.45 |
| 12 | 1.38 |
| 13 | 1.34 |
| 14 | 1.33 |
| 20 | 1.18 |
| 30 | 1.00 |
| 64 | 0.47 |

Here, the smallest value of Vi which enables each discrimination circuit Dj to output high-level output voltage Vaj is found by substituting the above parameters into Equation (16) above, thus:

$$Vi \geq (1/10 + 1/80)^{1/2} + (1/10)^{1/2} + 0.7 = 0.335 + 0.316 + 0.7 = 1.351(V).$$

Therefore, TABLE 1 reveals that, with the above specified parameters, the output voltages Vaj's in response to the input voltages having the largest values and slightly smaller ones can be sustained in the high level when k representing the number of the channels receiving the input voltages having the largest value and slightly smaller ones is not more than 13. It is known that, in case of the WTA judgment in image processing, k=10 if n=64. Thus, each basic circuit Cj can output the judgement result in a precise manner by setting the parameters in such a manner to enable the discrimination circuits Dj's in the expected k channels out of all the n channels to output high-level output voltages Vaj's individually.

As has been explained in the first embodiment, even when the basic circuits Cj's are cascaded in every input channel j, the output voltage Vo decreases as the k channels receiving input voltages having the largest value and slightly smaller ones increase, and drops below the high level of 2·Vdd/3, or 2V, and takes on an intermediate value between the high and low levels. In contrast, the WTA circuit 41 of the present embodiment can solve such a problem in the manner explained above.

In addition, when the basic circuits Cj's are cascaded, transistors as many as four (transistors Q6 through Q9) multiplied by n representing the number of all the channels plus the transistor Q10, that is, 4n+1, can be omitted per stage in the second embodiment compared with the first embodiment. As a result, not only the circuit structure can be simplified, but also the power consumption can be reduced.

(Third Embodiment)

Figure 3:
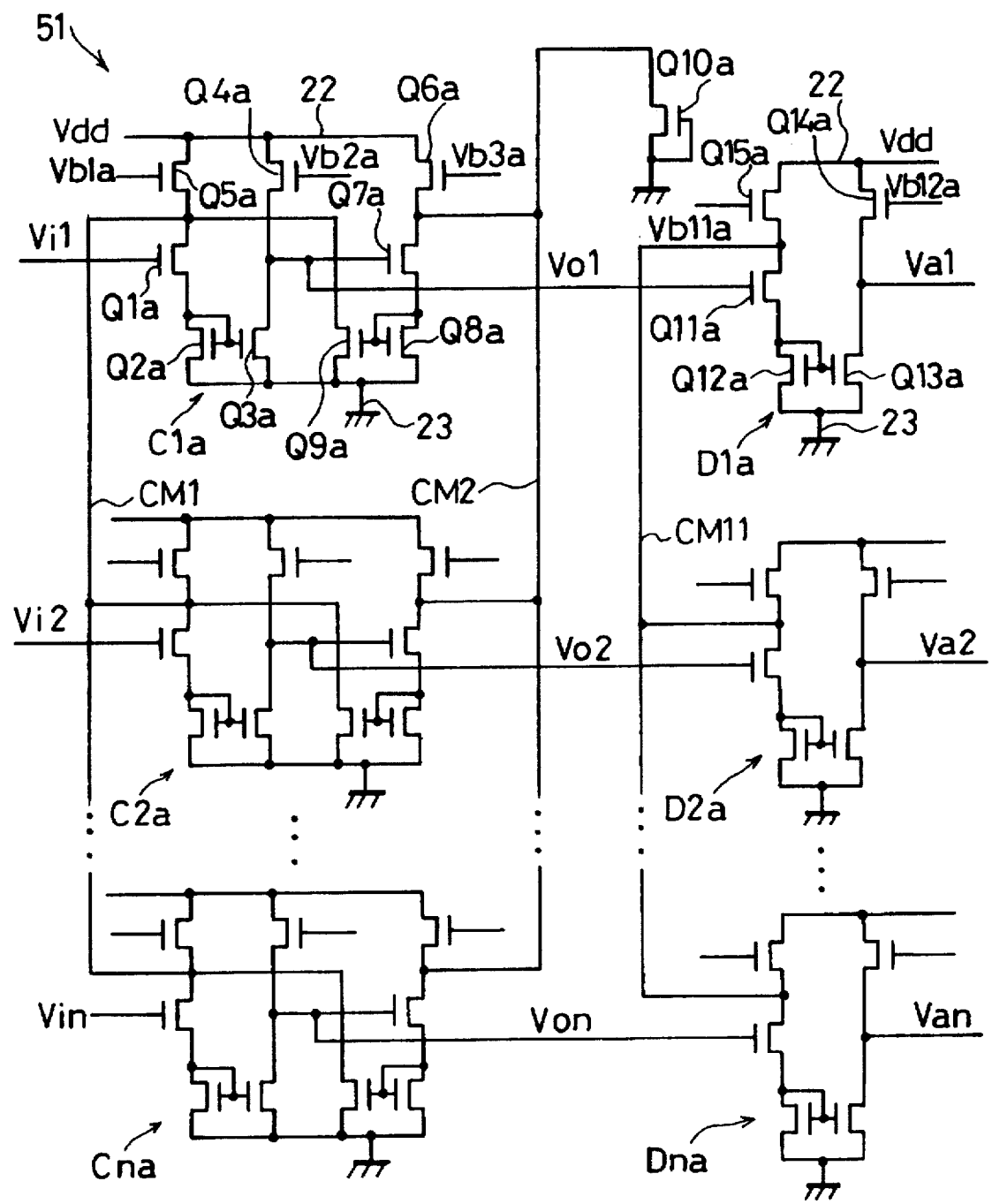
FIG. 3 is an electrical circuit diagram of a WTA circuit in accordance with still another example embodiment of the present invention.
Figure 4:
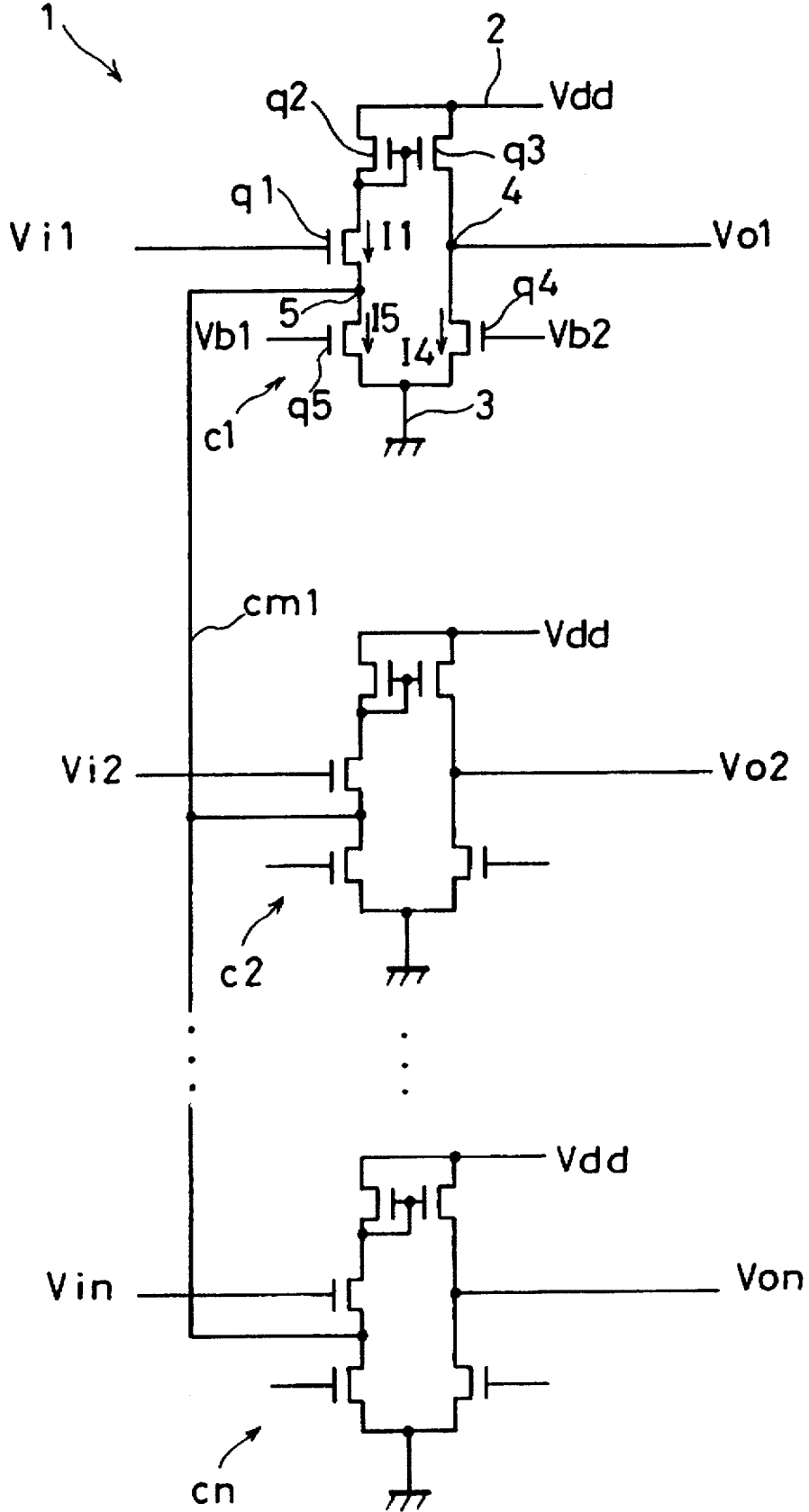
FIG. 4 is an electrical circuit diagram of a typical WTA circuit of a prior art.

Referring to FIG. 3, the following description will describe still another example embodiment of the present invention.

FIG. 3 is an electric circuit diagram of a winner-take-all (WTA) circuit 51 of the present embodiment. The WTA circuit 51 is of the same structure as the counterpart in the second embodiment except that the polarity of all the transistors are reversed.

To be more specific, the transistors Q1, Q4, Q5, Q6, Q7, Q10, Q11, Q14, Q15 are made of N-MOSFET's in the second embodiment but the same are made of P-MOSFET's herein. Likewise, the transistors Q2, Q3, Q8, Q9, Q12, and Q13 are made of P-MOSFET's in the second embodiment but the same are made of N-MOSFET's herein. Thus, the components corresponding to those in the counterpart in the second embodiment are labeled with the like numeral references with a small letter a attached in the end and the identical components are labeled with the same numeral references.

Thus, the transistors Q1a through Q15a operate in a manner reversed to the transistors Q1 through Q15 in the second embodiment in response to their respective input voltages Vij's, and a only channel whose input voltage Vij has the smallest value outputs the low-level output voltage Vaj equal to or lower than Vdd/3. Therefore, modifying the conduction direction of the transistors Q1 through Q15 and varying the constant voltages Vb1, Vb2, Vb3, Vb11, and Vb12 of the WTA circuit 41 can make another type of WTA circuit capable of judging the channel receiving an input voltage having the smallest value.

For a fuller understanding of the nature and advantages of the invention, reference should be made to the ensuing detailed description taken in conjunction with the accompanying drawings.

What is claimed is:

1. A winner-take-all circuit for judging an input voltage having one of a largest and smallest value among multiple input voltages comprising:

(1) a plurality of detecting units each including, (a) a first transistor for conducting a current in an amount defined by a balance between one input voltage and a reference voltage, (b) a second transistor interposed between said first transistor and a first power source line, (c) a third transistor, connected to said first power source line, for making a pair with said second transistor to form a current mirror circuit, (d) a fourth transistor, interposed between said third transistor and a second power source line, for conducting a predetermined amount of a current, and (e) a fifth transistor, interposed between said first transistor and said second power source line, for conducting a predetermined amount of a current, said each detecting unit outputting a voltage representing a result of a largeness detection among said input voltages from a connecting point of said third and fourth transistors, said plurality of detecting units being interconnected in parallel to hold connecting points of said first and fifth transistors in all of said detecting units at a same potential, (2) feedback current generating circuits in matching numbers with said detecting units each including, (f) a sixth transistor, connected to said second power source line, for conducting a predetermined amount of a current;

(g) a seventh transistor, connected to said sixth transistor, for conducting a current in an amount defined by a balance between a terminal voltage of said sixth transistor and an output voltage from the detecting unit;

(h) an eighth transistor interposed between said seventh transistor and said first power source line; and (i) a ninth transistor, connected to said first power source line, for making a pair with said eighth transistor to form a current mirror circuit, and for supplying a feedback current to said connecting point between said first and fifth transistors for varying said reference voltage;

(3) a tenth transistor serving as a common transistor, interposed between said first power source line and said each sixth transistor, for supplying a bias current defined by a terminal voltage of said each sixth transistor to said each sixth transistor, wherein, let r(9,8) be a ratio of gate width-to-length ratios of said ninth and eighth transistors, r(10,7) be a ratio of gate width-to-length ratios of said tenth and seventh transistors, I5 and I6 be currents respectively flowing through said fifth and sixth transistors, then I5, I6, r(9,8), and r(10,7) are respectively set to specific values to satisfy a following equation:

$$r(9,8) \cdot I6 \cdot \{2/(2+r(10,7))\} > I5.$$

2. The winner-take-all circuit as defined in claim 1, wherein all of said first through tenth transistors operate in a saturation region.

3. The winner-take-all circuit as defined in claim 1 further comprising discrimination circuits in matching numbers with said detecting units, said each discrimination circuit being a judging circuit for receiving an output voltage from said each detecting unit individually and outputting said output voltage after judging a level thereof, said discrimination circuit, being of a same structure as said each detecting unit, including five transistors equivalent to said first through fifth transistors, respectively.

4. The winner-take-all circuit as defined in claim 3, wherein said first, fourth, fifth, sixth, seventh, and tenth transistors are respectively N-MOS field effect transistors, and said second, third, eighth, and ninth transistors are respectively P-MOS field effect transistors.

5. The winner-take-all circuit as defined in claim 3, wherein said first, fourth, fifth, sixth, seventh, and tenth transistors are respectively P-MOS field effect transistors, and said second, third, eighth, and ninth transistors are respectively N-MOS field effect transistors.

6. The winner-take-all circuit as defined in claim 3, wherein all of said first through tenth transistors operate in a saturation region.

* * * * *